US008934643B2

(12) United States Patent
Aarts et al.

(10) Patent No.: US 8,934,643 B2
(45) Date of Patent: Jan. 13, 2015

(54) GENERATION OF A DRIVE SIGNAL FOR SOUND TRANSDUCER

(75) Inventors: Ronaldus Maria Aarts, Eindhoven (NL); Thomas Pieter Jan Peeters, Mariakerke (BE)

(73) Assignee: Koninklijke Philips N.V., Eindhoven (NL)

( * ) Notice: Subject to any disclaimer, the term of this patent is extended or adjusted under 35 U.S.C. 154(b) by 1093 days.

(21) Appl. No.: 12/935,955

(22) PCT Filed: Apr. 3, 2009

(86) PCT No.: PCT/IB2009/051406
§ 371 (c)(1), (2), (4) Date: Nov. 9, 2010

(87) PCT Pub. No.: WO2009/125326
PCT Pub. Date: Oct. 15, 2009

(65) Prior Publication Data
US 2011/0044471 A1 Feb. 24, 2011

(30) Foreign Application Priority Data
Apr. 9, 2008 (EP) .................................... 08154257

(51) Int. Cl.
*H03G 5/00* (2006.01)
*H04R 3/04* (2006.01)
*H04R 1/26* (2006.01)

(52) U.S. Cl.
CPC .............. *H04R 3/04* (2013.01); *H04R 2430/03* (2013.01); *H04R 1/26* (2013.01)
USPC .................. 381/98; 381/61; 381/106; 381/99

(58) Field of Classification Search
CPC .................................. H03G 3/00; H03G 5/00
USPC ....................................... 381/61, 98–99, 106
See application file for complete search history.

(56) References Cited

U.S. PATENT DOCUMENTS 4,562,591 A * 12/1985 Stikvoort ...................... 381/106
5,706,356 A * 1/1998 Walden ......................... 381/106
RE38,822 E * 10/2005 Aarts et al. ...................... 381/61
8,000,824 B2 * 8/2011 Shimura et al. ................. 700/94
8,094,835 B2 * 1/2012 Shimura et al. .............. 381/94.1
(Continued)

FOREIGN PATENT DOCUMENTS

CN 1877988 A 12/2006
JP 2005175674 A 6/2005
(Continued)

*Primary Examiner* — Disler Paul

(57) ABSTRACT

An apparatus for generating a drive signal for a sound transducer (109) comprises a sound generator (101) which provides an input audio signal. A divider (101) divides the input audio signal into at least a low frequency signal and a high frequency signal and an expander (105) generates an expanded signal by applying a dynamic range expansion to the low frequency signal. A combiner (107) then generates the drive signal by combining the expanded signal and the higher frequency signal. The threshold for applying the dynamic range extension may be adjusted depending on the amplitude of the low frequency signal. The low frequency signal may furthermore be compressed into a narrow frequency band around a resonance frequency. The approach may allow improved audio quality especially from high Q low frequency sound transducers by attenuating decay parts of bass signals thereby reducing sustain or ringing for bass notes.

15 Claims, 6 Drawing Sheets

(56) References Cited

U.S. PATENT DOCUMENTS

| | | | | |
|---|---|---|---|---|
| 8,150,050 | B2 * | 4/2012 | Lee et al. | 381/61 |
| 2002/0057808 | A1 * | 5/2002 | Goldstein | 381/106 |
| 2002/0126861 | A1 | 9/2002 | Colby | |
| 2004/0096068 | A1 | 5/2004 | Sato | |
| 2006/0274903 | A1 | 12/2006 | Aoki et al. | |
| 2007/0098182 | A1 | 5/2007 | Aarts et al. | |
| 2007/0274538 | A1 | 11/2007 | Kpenv | |
| 2008/0175409 | A1 * | 7/2008 | Lee et al. | 381/98 |

FOREIGN PATENT DOCUMENTS

| | | | |
|---|---|---|---|
| WO | 2005027568 | A1 | 3/2005 |
| WO | 2007049200 | A1 | 5/2007 |
| WO | 2007054888 | A2 | 5/2007 |
| WO | 2007086000 | A2 | 8/2007 |

* cited by examiner

GENERATION OF A DRIVE SIGNAL FOR SOUND TRANSDUCER

FIELD OF THE INVENTION

The invention relates to a method and apparatus for generating a drive signal for a sound transducer and in particular, but not exclusively, for generating a drive signal for a low frequency loudspeaker.

BACKGROUND OF THE INVENTION

There is a general desire for sound transducers, such as loudspeakers, to provide high efficiency, high quality and increased sound levels with increasingly smaller dimensions. However, these preferences tend to be conflicting requirements resulting in a careful trade-off between different preferences.

For example, audio loudness is related to the amount of air that a loudspeaker displaces with the displacement being frequency dependant such that if the sound pressure level is kept constant then the lower the frequency, the bigger the required displacement. For these low frequencies the mechanical power handling of a loudspeaker is usually the limiting factor rather than the electrical power handling, and in order to provide the required sound levels relatively large physical dimensions tend to be needed. More specifically, sound reproduction with small transducers at low frequencies with a reasonable efficiency and sound level is very difficult as the efficiency is inversely proportional to the moving mass and proportional to the square of the product cone area and force factor.

In order to obtain high sound levels and efficiency from small and typically cheaper devices, transducers can be used which have a high resonance peak (high Q value). However, this tends to result in reduced audio quality and in particular tends to provide a low frequency (bass) sound which is often perceived as booming with a relatively high bass sustain or ringing.

European Patent Application EPO4769892.3 discloses a system wherein a given sound pressure level can be achieved by a sound transducer with reduced physical dimensions. In accordance with the proposed system, a low frequency band of a signal is replaced by a fixed single frequency carrier signal with a frequency close to a resonance frequency of a loudspeaker. The amplitude of the carrier follows the amplitude of the signal components falling in the low frequency band. Thus, effectively a low frequency signal component is replaced by a single tone carrier with an amplitude equal to the signal component. Thus, by concentrating the low frequency signal into a single carrier frequency close to the resonance frequency of the loudspeaker, a much higher efficiency of the loudspeaker can be achieved. Furthermore, as the mechanical power handling and air displacement capability of a loudspeaker is highest around the resonance frequency, smaller dimensions of the sound transducer can be achieved by this approach.

However, although the approach can provide substantial advantages in many scenarios it also has some associated disadvantages. In particular, the approach tends to distort the low frequency sound signal and may in some scenarios result in a suboptimal sound quality.

Specifically, in some scenarios and environments, some listeners have indicated that the generated sound sometimes may be perceived more boomy or tonal than preferred. In particular, in some scenarios a very high Q-factor of the transducer may result in the generated signal being perceived to continue to ring longer than the original signal.

Hence, an improved audio system would be advantageous and in particular a system allowing increased flexibility, facilitated implementation, improved audio quality, increased efficiency, reduced physical dimensions of a sound transducer and/or improved performance would be advantageous.

SUMMARY OF THE INVENTION

Accordingly, the Invention seeks to preferably mitigate, alleviate or eliminate one or more of the above mentioned disadvantages singly or in any combination.

According to an aspect of the invention there is provided an apparatus for generating a drive signal for a sound transducer, the apparatus comprising: a source for providing an input audio signal; a divider for dividing the input audio signal into at least a low frequency signal and a high frequency signal; an expander for generating an expanded signal by applying a dynamic range expansion to the low frequency signal; and a combiner for generating the drive signal by combining the expanded signal and the higher frequency signal.

The invention may in many embodiments provide improved audio performance and/or facilitated and/or improved implementation. For example, in many embodiments, improved sound quality and/or reduced sound transducer dimensions may be achieved. In particular, in many embodiments an improved sound quality from sound transducers with a high resonance effect (high Q) may be achieved. The invention may e.g. allow high Q transducers to be used for sound reproduction while maintaining a required audio quality level thereby allowing reduced size and/or increased efficiency and/or increased sound levels.

The dynamic range expansion may in particular in many embodiments reduce a sustain or ringing of the produced bass sound thereby mitigating the perceived impact of using high Q transducers. In particular, in some scenarios and for some sound systems, a reduced booming or reduced tonal low frequency sound may be perceived resulting in a more punchy bass sound being experienced.

The dynamic range expansion is an expansion that increases the dynamic amplitude range of the low frequency signal. Specifically, low amplitude values may be reduced. The dynamic range expansion may specifically be an amplitude level expansion.

The low frequency signal may comprise signal components in a frequency band with a lower center frequency than a center frequency of a frequency band of the high frequency signal. The low frequency signal may specifically be generated by a low pass filtering or low frequency band pass filtering of the input audio signal. The high frequency signal may be generated as the residual signal obtained by subtracting the low frequency signal from the input audio signal. As another example, the high frequency signal may be generated by a filtering of the audio input signal using a high pass filter or a band pass filter having a center frequency higher than for a filter generating the low frequency signal.

The sound transducer may be a device for converting an electrical drive signal into an acoustic signal. The sound transducer may specifically be a loudspeaker. It will be appreciated that any suitable means of defining or determining the first and/or second frequency intervals may be used. For example, an edge of a frequency interval may be determined as a frequency wherein an attenuation of the signal falls below a given threshold.

The source may be any means or functionality capable of providing an audio signal. The source may retrieve the input audio signal from an internal or external store or may receive the signal from elsewhere. Specifically, the source may be a receiver for receiving the audio input signal from another functional or physical entity.

In accordance with an optional feature of the invention, the expander is arranged to attenuate the low frequency signal if the input audio signal meets a first criterion.

This may allow an improved and/or facilitated implementation and/or improved performance. The criterion may specifically be a requirement for the low frequency signal. The attenuation may be determined by a fixed, signal independent function.

In accordance with an optional feature of the invention, the first criterion comprises a requirement that an amplitude level of the low frequency signal is below a threshold.

This may allow an improved and/or facilitated implementation and/or improved performance. In particular, it may allow the expansion to be applied to the low frequency signal by attenuating low amplitude levels thereby reducing the booming or ringing of the bass sound resulting in a more punchy bass sound being experienced.

The threshold may be a variable threshold and may for example be determined in response to a characteristic of the low frequency signal.

In accordance with an optional feature of the invention, the expander is arranged to delay an application of a full attenuation of the low frequency signal following the detection of the first criterion being met.

This may allow improved performance and may in particular allow improved perceived audio quality. In particular, undesired audio artifacts introduced by switching on the dynamic range expansion may be reduced or attenuated resulting in improved audio quality of the resulting signal.

The feature may introduce an attack time parameter for controlling a delay in the onset of the dynamic range expansion. The delay may for example be a delay after which the attenuation is applied or may be a time interval in which the attenuation is gradually increased from zero to the full attenuation. The full attenuation may be dependent on the low frequency signal (e.g. the amplitude thereof) and may specifically be given by a time invariant function such as an expander gain law function.

Particularly advantageous performance may be achieved for a delay or attack time of around 5-15 msec with typically very high performance for a delay or attack time of substantially 10 msec.

In accordance with an optional feature of the invention, the expander is arranged to terminate applying attenuation to the low frequency signal in response to a detection that the input audio signal meets a second criterion; and to delay the termination of applying attenuation to the low frequency signal following the detection of the second criterion being met.

This may allow improved performance and may in particular allow improved perceived audio quality. In particular, undesired audio artifacts introduced by switching off the dynamic range expansion may be reduced or attenuated resulting in improved audio quality of the resulting signal.

The feature may introduce a release time parameter for controlling a delay in the switch off of the dynamic range expansion. The delay may for example be a delay after which the attenuation is removed or may be a time interval in which the attenuation is gradually reduced from full attenuation to zero. The full attenuation may be dependent on the low frequency signal (e.g. the amplitude) and may specifically be given by a time invariant function such as an expander gain law function.

The second criterion may specifically be the opposite of the first criterion. Thus, in some embodiments, the attenuation may be switched off when the first criterion is no longer met.

Particularly advantageous performance may be achieved for a delay or release time of around 15-25 msec with typically very high performance for a delay or release time of substantially 20 msec.

In accordance with an optional feature of the invention, the apparatus further comprises means for determining an averaged amplitude level indication for the low frequency signal; and setting means for setting a characteristic of the dynamic range expansion in response to the averaged amplitude level indication.

This may allow an improved and/or facilitated implementation and/or improved performance. The feature may allow a more advanced adaptation of the dynamic range expansion application and may in particular allow the application of the dynamic range expansion to be adapted to the low frequency signal. In particular, the feature may allow that the dynamic range expansion is dependent not only on the current amplitude level but also on an average amplitude level. This may for example allow temporal characteristics, signal variations, derivative values (such as a slope of the amplitude variation) to be taken into account in the dynamic range expansion.

The averaged amplitude level may e.g. be determined as an RMS (Root Mean Square) value, a low pass filtered value of the low frequency signal, an averaged peak detection output, a moving average of the low frequency signal etc.

In accordance with an optional feature of the invention, the characteristic is a criterion for applying an attenuation to the low frequency signal.

This may allow an improved and/or facilitated implementation and/or improved performance. The feature may allow a more advanced adaptation of the application of the dynamic range expansion and may in particular allow the application of the dynamic range expansion to be adapted to variations of the amplitude of the low frequency signal.

In accordance with an optional feature of the invention, the criterion comprises a requirement that a current amplitude is below an amplitude threshold, and the setting means is arranged to determine the amplitude threshold in response to the averaged amplitude level indication.

This may allow an improved and/or facilitated implementation and/or improved performance. The feature may allow a more advanced adaptation of the application of the dynamic range expansion and may in particular allow the dynamic range expansion to be dependent on short term amplitude characteristics as well as longer term amplitude characteristics. In particular, the dynamic range expansion may be dependent on how the short term amplitude level relates to the longer term amplitude level. In particular, this may e.g. be used to predominantly apply the dynamic range expansion to a falling amplitude slope and not to a rising amplitude slope.

The current amplitude level is determined for a shorter time interval of the low frequency signal than the averaged amplitude level indication. The current amplitude level and the averaged amplitude level may differ only in the time intervals over which they are determined or may e.g. be determined using different amplitude measurement approaches. For example, one measure may be based on a peak detection whereas the other may be based on an RMS measurement.

In accordance with an optional feature of the invention, the setting means is arranged to determine the amplitude threshold substantially as:

$$T=c\cdot A_A$$

where T is the amplitude threshold, c is a constant and $A_A$ is an averaged amplitude level of the low frequency signal indicated by the averaged amplitude level indication.

This may allow an improved and/or facilitated implementation and/or improved performance.

In accordance with an optional feature of the invention, a time constant for determining the averaged amplitude level indication is between 75 and 200 msec.

This may allow an improved and/or facilitated implementation and/or improved performance. In particular, it has been found that advantageous performance is achieved for the averaged amplitude level indication being determined for a time interval having a duration of between 75 and 200 msec. In particular, a time constant of between 130 msec and 170 msec may in many scenarios provide advantageous performance.

In accordance with an optional feature of the invention, the apparatus further comprises frequency compression means arranged to perform a frequency compression of at least one of the expanded signal and the low frequency signal from a first frequency interval to a smaller second frequency interval corresponding to a resonance frequency of the sound transducer.

The feature may allow improved generation of a drive signal for a sound transducer. In particular, the feature may allow an improved trade-off between generated sound levels, efficiency, audio quality and transducer size. The invention may allow reduced dimensions of the sound transducer and may in particular allow increased sound levels from smaller sound transducers.

In some embodiments, the frequency compression means may be arranged to generate a second signal having a frequency bandwidth limited to the second frequency interval from the low frequency signal where the second signal may be generated to have an amplitude, power and/or energy measure corresponding to that of the low frequency signal. Specifically, an amplitude detector may generate an amplitude measure for the low frequency signal and an amplitude of the second signal may be set accordingly.

In accordance with an optional feature of the invention, the frequency compression means is arranged to perform the frequency compression of the low frequency signal prior to the dynamic range expansion; and the apparatus further comprises: means for determining an averaged amplitude level indication for the low frequency signal component prior to the frequency compression; and setting means for setting a characteristic of the dynamic range expansion in response to the averaged amplitude level indication.

This may allow an improved and/or facilitated implementation and/or improved performance.

In accordance with an optional feature of the invention, the frequency compression means comprises: an amplitude detector for generating an amplitude signal for the at least one of the low frequency signal and the expanded signal; a frequency generator for generating a carrier signal in the second frequency interval; a modulator for generating a frequency compressed version of the at least one of the low frequency signal and the expanded signal by modulating the carrier signal by the amplitude signal.

This may allow particularly advantageous performance and/or facilitated operation. The approach may allow the sound transducer to be driven very close to the resonance frequency thereby increasing sound level output for given mechanical and/or physical characteristics. The feature may alternatively or additionally allow low complexity frequency compression which specifically may result in a highly concentrated frequency spectrum with has power and/or amplitude characteristics corresponding to the characteristics of the first signal.

The drive signal may be generated such that it substantially corresponds to the frequency compressed signal in the first frequency interval. The amplitude signal may specifically be substantially limited to frequencies below 5 Hz. The frequency interval of the low frequency signal may specifically have a lower limit above 10 Hz and an upper limit below 250 Hz.

In some embodiments the carrier signal may have a fixed frequency which specifically may correspond to the resonance frequency. Alternatively, the carrier signal may have a dynamically varying frequency, e.g. dependent on the input signal and/or the first signal.

In accordance with an optional feature of the invention, the apparatus further comprises means for determining whether to apply the dynamic range expansion in response to the amplitude signal.

This may allow an improved and/or facilitated implementation and/or improved performance. E.g., the amplitude signal may be compared to a threshold and the dynamic range expansion may be applied only if the amplitude signal is below the threshold.

According to another aspect of the invention there is provided a method of generating a drive signal for a sound transducer, the method comprising: providing an input audio signal; dividing the input audio signal into at least a low frequency signal and a high frequency signal; generating an expanded signal by applying a dynamic range expansion to the low frequency signal; and generating the drive signal by combining the expanded signal and the higher frequency signal.

According to another aspect of the invention there is provided an apparatus for generating a drive signal for a sound transducer, the apparatus comprising: means for providing an input audio signal; a divider for dividing the input audio signal into at least a low frequency signal and a high frequency signal; an expander for generating an expanded signal by applying a dynamic range expansion to the low frequency signal; frequency compression means arranged to perform a frequency compression of at least one of the expanded signal and the low frequency signal from a first frequency interval to a smaller second frequency interval corresponding to a resonance frequency of the sound transducer; and a driver for generating the drive signal in response to the expanded signal.

It will be appreciated that the features, advantages, comments etc described above are equally applicable to this aspect of the invention.

According to another aspect of the invention there is provided a method for generating a drive signal for a sound transducer, the method comprising: providing an input audio signal; dividing the input audio signal into at least a low frequency signal and a high frequency signal; generating an expanded signal by applying a dynamic range expansion to the low frequency signal; performing a frequency compression of at least one of the expanded signal and the low frequency signal from a first frequency interval to a smaller second frequency interval corresponding to a resonance frequency of the sound transducer; and generating the drive signal in response to the expanded signal.

These and other aspects, features and advantages of the invention will be apparent from and elucidated with reference to the embodiment(s) described hereinafter.

BRIEF DESCRIPTION OF THE DRAWINGS

Embodiments of the invention will be described, by way of example only, with reference to the drawings, in which.

DETAILED DESCRIPTION OF THE EMBODIMENTS

Figure 1:
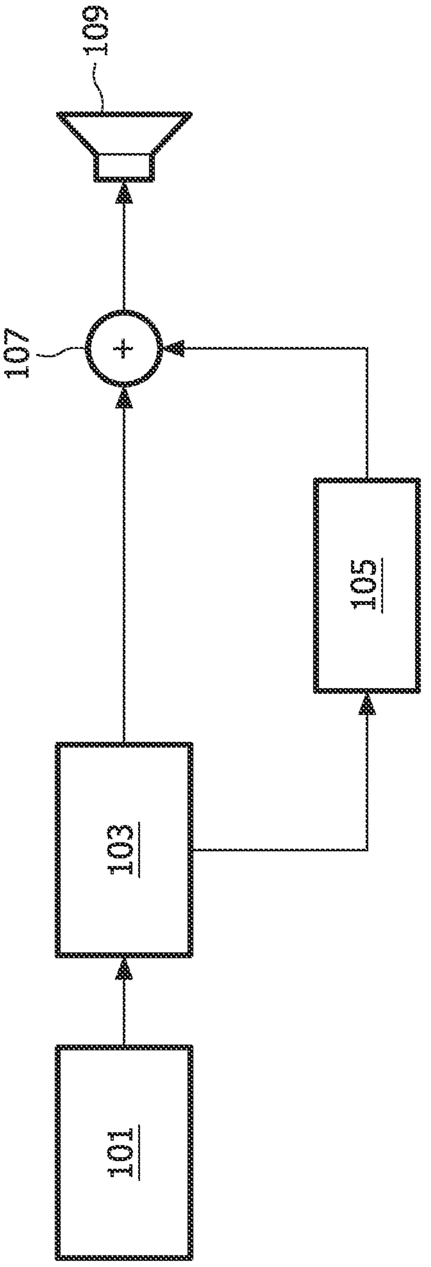
FIG. 1 is an illustration of an example of a sound system in accordance with some embodiments of the invention.

FIG. 1 illustrates an example of a sound system in accordance with some embodiments of the invention.

In the example, an audio source 101 provides an input audio signal. The audio signal may for example be provided from an internal source (such as a local audio signal store) or may be removed from a remote source such as from a remote sound generation device. Thus, the audio source 101 may specifically be a receiver which receives an audio signal from any suitable remote or local sound generator or store via any suitable means.

The audio source 101 is coupled to a divider 103 which divides the input audio signal into a low frequency signal and a high frequency signal. It will be appreciated that in some embodiments, the divider 103 may divide the signal into more signals than only the low frequency signal and the high frequency signal. For example, the divider may generate a plurality of high frequency signals, for example covering different frequency bands. Equivalently, the high frequency signal may be considered as a composite signal comprising a plurality of separate high frequency subsignals. For example, one subsignal may correspond to a midtone range and another subsignal may correspond to a treble range.

The divider 103 is furthermore coupled to an expander 105 which is fed the low frequency signal. The expander 105 is arranged to apply a dynamic range expansion to the low frequency signal thereby generating a low frequency expanded signal. The expander 105 and the divider 103 are coupled to a combiner 107 which combines the expanded signal and the high frequency signal to generate a sound transducer sound signal. The combiner 107 is coupled to the sound transducer 109. It will be appreciated that for brevity and clarity, only the features of the sound system required for describing specific aspects of the operation have been included in FIG. 1 and that the audio system may comprise additional elements as required or desired for the individual application. For example, it will be appreciated that the audio system may include volume control or audio amplifiers e.g. coupled between the combiner 107 and the sound transducer 109.

In the example, the sound transducer 109 is a high resonance loudspeaker (a high Q speaker) with a substantial resonance frequency at lower frequencies (e.g. below 300 Hz). The use of a high Q speaker may allow a high sound level and high efficiency for lower frequencies from a relatively small sound transducer. However, the user of a high Q sound transducer may in some scenarios result in the perception of a lower audio quality. In particular, in some scenarios some listeners tend to perceive an increased sustain or ringing of bass signals. For example, a base drum may be perceived as boomy and ringing.

In the example of FIG. 1 the application of the expander 105 seeks to mitigate this effect. In particular, the expander 105 is in the example arranged to attenuate the low frequency signal if the input audio signal meets a first criterion which in the specific example is a requirement that the an amplitude level of the low frequency signal is below a threshold.

An expander is generally used to enlarge the dynamic range properties of a signal. In the example, whenever the signal amplitude falls below the threshold, the expander 105 lowers the amplitude of the signal by a given value. Enlarging the dynamic range of signals effectively increases the difference in amplitude between quieter and louder parts of a signal.

An expander is typically associated with a number of characteristics. One characteristic is the attack time which is the time it takes for the expander to start attenuating after the threshold is crossed. The release time for an expander is the time it takes for the expander to return to normal (non attenuating) operation after the signal amplitude exceeds the threshold. In many cases, the attenuation of the expander is characterized by a gain factor function which relates the input amplitude level and the output amplitude level.

In the specific example, the gain factor function when the amplitude level is below the threshold is given by:

$$G_E = 10^{(-D/20)}$$

$$D = (Th_E - Th_{RMS}) \cdot \frac{1 - R_E}{R_E}$$

where $Th_{RMS}$ is the input signal level in dB, $Th_E$ is the threshold level in dB and $R_E$ is the expansion ratio.

When the amplitude level is above the threshold, the gain factor function is equal to one ($G_E=1$).

The expansion ratio indicates the degree of attenuation and specifically it determines the slope of the transfer function applied to the signal amplitude. Thus, a ratio of 1:4 signifies a decrease of 4 dB in the output signal level when the input signal is 1 dB below the threshold. The expansion ratio is between 0 and 1.

Thus, the expander 105 further reduces the amplitude of the low frequency signal when this is below the threshold. For bass sounds with a loud attack part and a loudness decreasing decay part, this will lower the amplitude of the decay part even more resulting in improved perceived sound quality.

Thus, in the example, the expander 105 can further reduce the amplitude levels of the low frequency signal when the amplitude level thereof is low thereby increasing the dynamic range of the low frequency signal. The dynamic range expansion may in many scenarios improve the perceived audio quality. For example, if the input audio signal comprises a bass drum hit, the amplitude volume of the main part of the resulting signal will have a relatively high volume and accordingly the amplitude of the low frequency signal will exceed the threshold. As a result, the low frequency signal is unaffected by the expander 105 and the sound transducer 109 will proceed the same signal as if the expander 105 had not been included in the sound system. However, as the sound of the bass drum hit begins to fade, the volume of the low frequency signal will fall below the threshold. At this point, the expander 105 will further attenuate the amplitude level of the low frequency signal thereby resulting in the sound level of the bass drum in the generated output signal being further reduced. Accordingly, the ringing or sustain of the bass drum hit is perceived as being reduced thereby resulting in a perception of a more punchy bass with reduced boomyness and ringing.

In the specific example of FIG. 1, the expander 103 is arranged to delay an application of the full attenuation of the low frequency signal following the detection of the criterion being met. In particular, the attenuation given by the gain factor function is not immediately applied but is only fully applied after a given time interval. In the specific example, the attenuation is gradually introduced over the time interval thereby providing a smooth introduction of the dynamic range expansion. As a simple example, the applied gain may be given by:

$$G = 1 - \frac{t}{T} + \left(\frac{t}{T}\right) \cdot G_E$$

for 0<t<T where t is the duration since the threshold was crossed and T is the delay duration.

Thus, the attack time of the expander 105 may be controlled to provide an improved perceived audio quality.

The expander 105 is in the example arranged to terminate the application of the attenuation to the low frequency signal in response to a detection that the input audio signal meets a second criterion which in the specific example corresponds to the amplitude of the low frequency signal increasing above the threshold. Thus, in the example, symmetric criteria are used to switch the dynamic range expansion on and off but it will be appreciated that in other embodiments an asymmetric arrangement may possibly be used.

The expander 105 is in the example arranged to delay the termination of the application of the attenuation to the low frequency signal following the detection of the threshold being exceed.

Similarly to the situation when the dynamic range expansion is switched on, the full switching off may thus be delayed and specifically a gradual switching off may be used. For example, the applied gain may be given by:

$$G = \frac{t}{T} + \left(1 - \frac{t}{T}\right) \cdot G_E$$

for 0<t<T where t is the duration since the threshold was exceeded and T is the delay duration (it will be appreciated that the delays may differ for the switching on and switching off of the dynamic range expansion).

Thus, the release time of the expander 105 may be controlled to provide an improved perceived audio quality.

The choice of the attack and release times affects the distortion and transparency attributes of the dynamic range expansion. In the audio system, short attack times are often desirable, as longer attack times can cause the expander to react too slowly resulting in a less pronounced addition of "punch". Also, release times which are too long will slow down the expander returning to normal resulting in signal peaks (transients) possibly also being attenuated. However, attack and release times which are too short tend to result in sudden amplitude changes when the dynamic range expansion is switched on or off. Such amplitude steps tend to be noticeable to the listener and are accordingly perceived as a quality degradation.

It has been found that in many scenarios, particularly advantageous times can be found for an attack time which is between 40% to 60% of the release time. In many scenarios, particularly advantageous performance is found for an attack or on delay time of 5-15 msec (and in many scenarios for an attack or on delay time of substantially 10 msec). In many scenarios, particularly advantageous performance is found for a release or off delay time of 15-25 msec (and in many scenarios for a release or off delay time of substantially 20 msec).

As a specific example, the expander 105 may be implemented by applying the following algorithm to each sample:

```
if rms < env
    theta = att;
  else
    theta = rel;
end
  env = (1.0 − theta) * rms + theta * env;
  gain = 1.0;
   if (env < thresh(n))
     gain = 10^((1−1/R)*(log10(thresh(n))−log10(env)));
  end
x(n) = x(n) * gain;
```

where

'att' and 'rel' are attack and release slopes calculated per sample.

att=exp (−1.0/tatt)

tatt=round(attack/1000*Fs)

attack=attack time in ms

Fs=sampling frequency rel=exp (−1.0/trel)

trel=round(release/1000*Fs)

release=release time in ms

Fs=sampling frequency

'R' is the expander ratio.

'thresh(n)' is the threshold value (which may be variable as will be described in the following)

'rms' is the RMS value of the low frequency signal.

'env' is the 'rms' value shaped by attack and release slopes. The initial value is zero.

In some embodiments, the dynamic range expansion may be dependent on characteristics of the low frequency signal. In particular, the criterion for when to apply the dynamic range expansion may depend on one or more characteristics of the low frequency signal.

Figure 2:
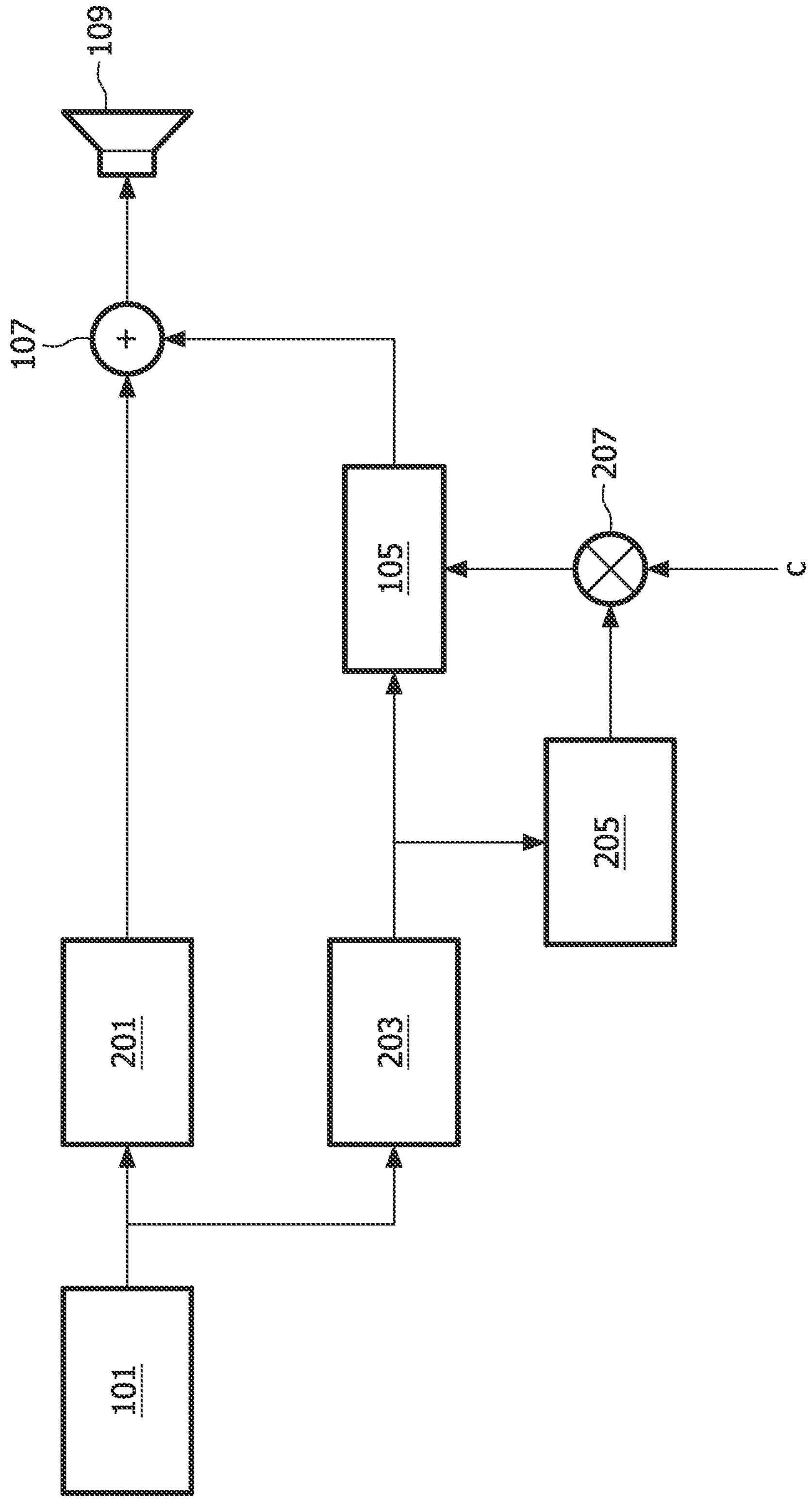
FIG. 2 is an illustration of an example of a sound system in accordance with some embodiments of the invention.

FIG. 2 shows an example of an enhancement of the system of FIG. 1 wherein the criterion for applying the dynamic range expansion depends on a characteristic of the low frequency signal. In the example, the threshold for when to apply the dynamic range expansion is specifically determined as a function of an averaged amplitude level indication for the low frequency signal.

In the system of FIG. 2, the divider 103 is implemented as a high pass filter 201 and a band pass filter 203. In the example, the high pass filter 201 has a cut-off frequency of around 150-200 Hz and generates the high frequency signal by filtering the input audio signal received from the audio source 101. The band pass filter 203 has a pass band of around 10-120 Hz and generates the low frequency signal by filtering the input audio signal received from the audio source 101. It will be appreciated that in other embodiments other filter characteristics may be used and that e.g. the low pass signal may be generated by a low pass rather than a band pass filter.

In the example, the band pass filter 203 is coupled to the expander 105 and to an amplitude averager 205. Thus, the low frequency signal is fed both to the expander 105 and the amplitude averager 205.

The amplitude averager 205 is arranged to generate an averaged amplitude level indication for the low frequency signal. It will be appreciated that any suitable method of generating an averaged or smoothed amplitude estimate may be used. For example, the amplitude averager 205 may apply a moving (sliding) averaging window or may be an RMS amplitude measure etc. It will be appreciated that the generated averaged amplitude level need not be a value that is identical to the average amplitude value in a given time interval but may be any amplitude level measure that includes some form of averaging of instantaneous values. Thus, depending on the specific requirements of the individual embodiment, any suitable smoothed or filtered amplitude measure may be used. For example, in some embodiments, the amplitude averager 205 may simply be a suitable low pass IIR or FIR filter.

In the example, the threshold for applying the dynamic range extension is determined as a fixed function of the amplitude level measure. It will be appreciated that any suitable function for determining the threshold as a function of the amplitude level measure may be used. In the specific example, a low complexity scaling function is used. In particular, the threshold for applying dynamic range extension is simply given substantially as:

$$T=c\cdot A_A$$

where T is the amplitude threshold, c is a constant and $A_A$ is the averaged amplitude level determined by the amplitude averager 205.

It will be appreciated that the performance and operation of the described system can be modified to the specific requirements of the individual embodiment by selecting suitable parameters for the averaging process and the relationship between the amplitude level measure and the threshold.

In the specific example, particularly advantageous performance has been found for a time constant for determining the averaged amplitude level indication being between 75 and 200 msec. In particular, in many embodiments a time constant of between 100 and 150 msec results in attractive performance allowing in particular the sustain or ringing of bass sounds being attenuated without the perception of the initial attack part being affected. The time constant may correspond to the duration before amplitude values are weighted by less than a given value in the averaging process. A typical value is between 0 and 0.5 of the maximum weighting applied in the averaging process. Typically a value of 0.2 may be used. For a binary-weighted (square) windowed averaging, the time constant is specifically equal to the window duration.

Furthermore, particularly advantageous performance has been found for a coefficient c of between 0.8 and 2 with particularly advantageous performance typically being achieved for values between 1 and 1.5 (and in particularly of substantially 1.2).

Thus, in the specific example, the threshold for applying the dynamic range extension is dynamically varied to adapt to the low frequency signal. In particular, the threshold value is a function of an averaged amplitude measure for the low frequency signal. In this way the threshold is lower for quieter parts of the signal and for parts with relatively constant amplitude as the averaged amplitude measure decreases resulting in the threshold being reduced. Thus, the approach may allow the system to adapt to different volume levels for the signal.

Furthermore, the approach introduces a temporal dependency in the application of the dynamic range expansion. Specifically, for rising signal levels, the current amplitude will typically be higher than the amplitude averaged over a longer time interval. Accordingly, the current amplitude will typically be higher than the threshold and no attenuation is introduced. However, for falling signal levels, the current amplitude will typically be lower than the amplitude averaged over a longer time interval. Accordingly, the current amplitude will typically be lower than the threshold and attenuation will be applied. Thus, not only will the system adapt to volume changes of the signal as a whole but by careful selection of the parameters and characteristics it can be achieved that the attenuation will tend to be predominantly applied signal parts with falling signal levels. Thus, the attenuation will typically be applied to the decaying or falling sections of a bass sound without impacting the initial rising sections. Thus, the approach allows the attenuation to particularly reduce the ringing or sustain which is often perceived as boomyness. Consequently a cleaner and punchier bass sound is experienced.

Figure 3:
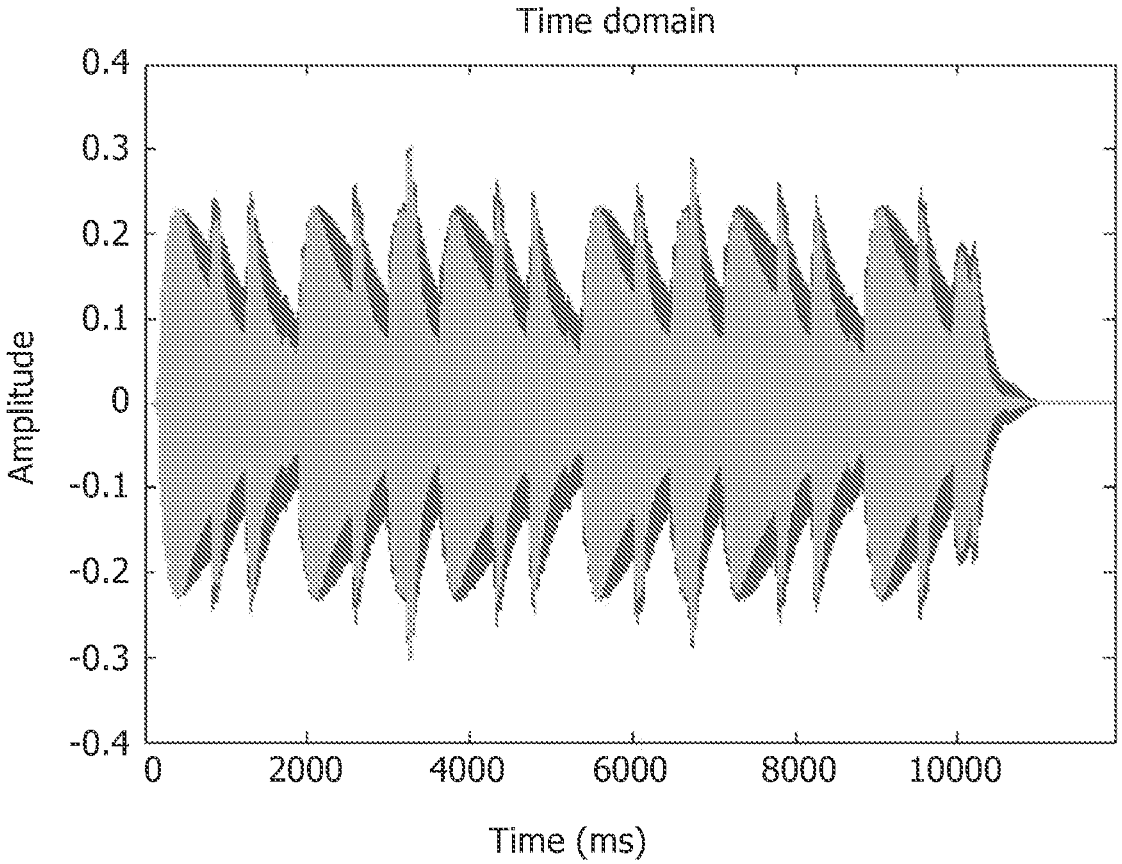
FIG. 3 is an illustration of a generated bass sound output from different sound systems.

FIG. 3 illustrates an example of a dynamic bass sound signal with and without the described processing. The signal corresponds to an approximately 10 second long signal comprising a number of bass notes (e.g. from a bass guitar being played). The typical audio signal produced by a sound transducer is represented by the combined light and dark grey envelope. The audio signal produced by the system of FIG. 2 is represented by the light grey envelope.

As can be clearly seen, the amplitude of the decay part of each individual note is substantially reduced without the amplitude of the initial attack part being affected. Thus, a substantial attenuation of the sustain or ringing of each individual bass note is achieved without sacrificing the initial attack of each note. This is perceived as a cleaner less boomy and punchier bass sound.

In some embodiments, the sound system furthermore comprises functionality for increasing the efficiency and sound level produced from the low frequency signal for a given size sound transducer. In particular, the sound system may be arranged to compress the low frequency signal into a narrow frequency range around a resonance frequency of the sound transducer.

The characteristics and performance of sound transducers depend on the physical properties of the specific sound transducer. In particular, the air displacement characteristics are dependent on the physical characteristics and accordingly the sound level that can be produced by a speaker without mechanical distortion is dependent on the physical characteristics. Typically, larger physical dimensions are required for increasing sound levels and lower frequencies as the amount of air that needs to be displaced increases. Accordingly, a trade-off is typically required between the low frequency sound level capabilities and the physical dimensions.

Furthermore, sound transducers typically have one or more resonance frequencies wherein the physical characteristics provide a maximum sensitivity of the sound transducer. Furthermore, at these resonance frequencies the speaker cone or membrane movement or excursions is minimized for a given output sound level. Thus, at these frequencies an increasing sound level can be produced before the cone excursion become so large that the mechanical limitations of the sound transducer start to introduce distortions. Thus, around the resonance frequency, increased sound levels and efficiency can be achieved and in the example of FIG. 4 this is exploited to provide an improved performance at low frequencies.

Figure 4:
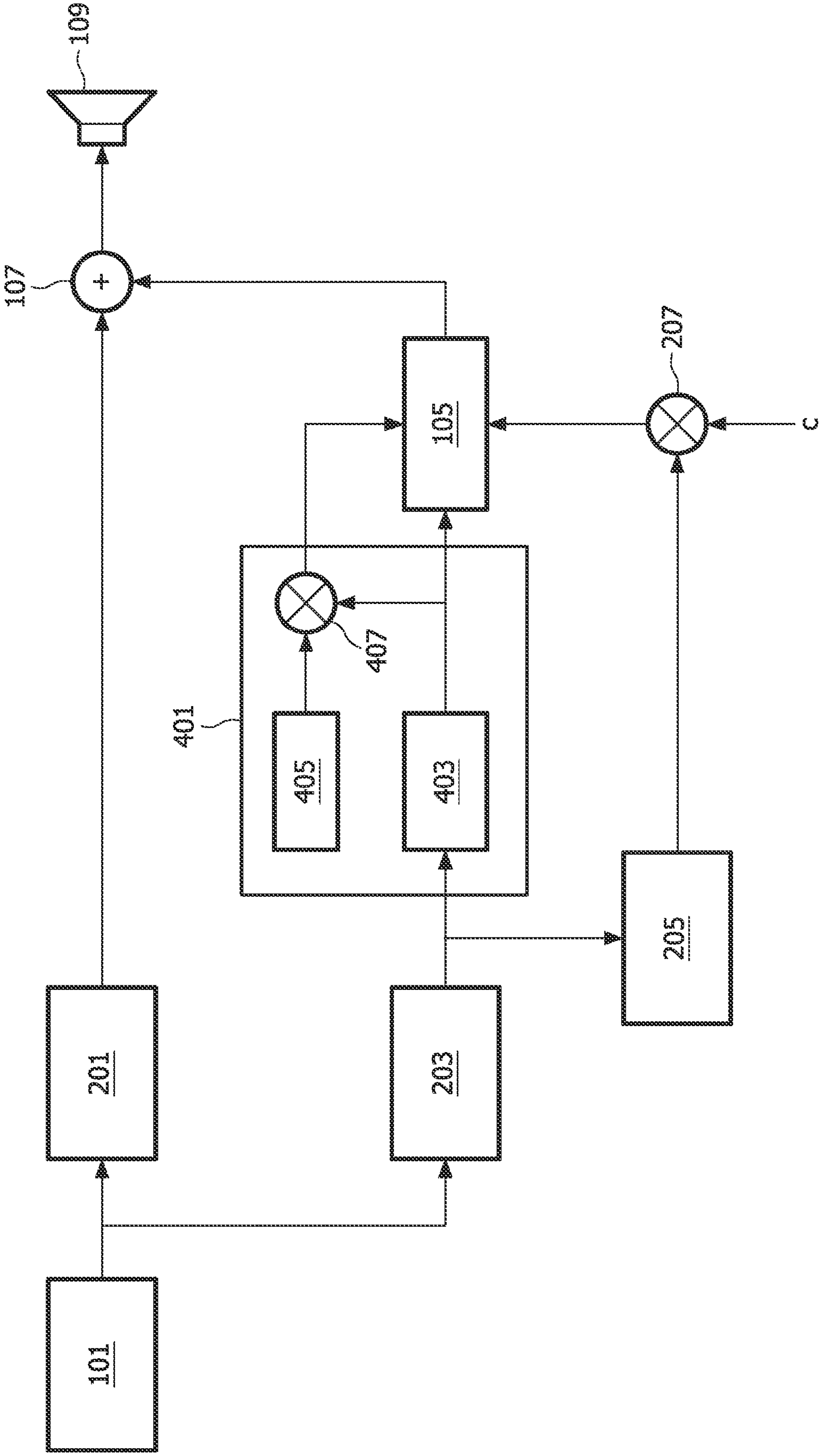
FIG. 4 is an illustration of an example of a sound system in accordance with some embodiments of the invention.

Specifically, the sound system of FIG. 4 comprises a frequency compressor 401 which is arranged to compress the frequency band/interval/range of the low frequency signal into a narrower more concentrated frequency band/interval/range located around the resonance frequency. Specifically, a low frequency band may be compressed to a narrow band around the resonance frequency thereby allowing a higher sound level to be generated at low frequencies for a given size of the loudspeaker or equivalently a smaller speaker may be used for a given desired sound level.

Furthermore, in the example, a sound transducer with a high Q at a suitable low frequency is used to provide increased efficiency and sound level in comparison to sound transducers having a more flat and homogenous frequency response. Furthermore, such speakers tend to be cheaper and simpler to produce as the requirement for a homogenous/flat frequency response can be removed or substantially reduced.

The frequency compressor 401 can effectively reduce the bandwidth of the low frequency signal by concentrating the energy thereof in a substantially narrower frequency band around the resonance frequency. This has the advantage that the energy of the audio signal is concentrated in a interval wherein the transducer is particularly effective and can produce higher sound levels. Thus, the described approach is based upon an insight that concentrating the low frequency signal in a relatively narrow band where sound transducers are most efficient allows a more effective use of the energy of the low frequency audio signal.

The bandwidth reduction is especially effective at relatively low frequencies, as it allows low-frequency transducers to be used which are particularly efficient in a narrow frequency range. It is therefore preferred in many embodiments that the low frequency signal has an upper frequency limit of not exceeding 200 Hz, preferably not exceeding 150 Hz, more preferably approximately 120 Hz.

Although the beneficial effect of the approach is already attained when the second interval is a little narrower than the first interval, for example 10% (that is, it has a bandwidth which is reduced by 10%), it is preferred that the second interval is substantially narrower, for example 50% or more. Depending on the type of transducer being used, the second interval may be very narrow and may have a bandwidth of only a few hertz.

Accordingly, in many embodiments, advantageous performance can be achieved when the compressed audio frequency range spans less than 50 Hz, preferably less than 10 Hz, more preferably less than 5 Hz. The compressed frequency range may even comprise only a single frequency, for example the resonance frequency of a transducer. In the example the compressed frequency range or interval may be an interval around 60 Hz, for example 55-65 Hz. This frequency interval is selected so that it corresponds with a particular transducer and will depend on the characteristics of the transducer. Specifically, the second interval is selected to include a resonance frequency of the transducer.

It will be appreciated that any suitable method of frequency compression may be used by the frequency compressor.

For example, in a digital implementation, the low frequency signal may be converted to the frequency domain using an N-point Discrete Fourier Transform (DFT) and specifically an N-point Fast Fourier Transform. The resulting frequency bin values may then be concentrated into a smaller number of bins and the remaining bin values set to zero. For example, N/2 consecutive bin values may be generated by averaging bin values of pairs of neighboring bins of the FFT. The resulting bin values are then allocated to the bins around the resonance frequency and the bin value of the non-assigned bins is set to zero. An inverse FFT can then be applied to generate a time domain version of the frequency compressed signal. This approach may accordingly correspond to compression of the bandwidth of the first signal by a factor of two with the compressed spectrum being located around the resonance frequency. It will be appreciated that the bandwidth of the frequency compressed signal may be varied by changing the number of bin values that are allocated values from the original transformed spectrum. For example, a frequency compression by a factor of four can be achieved by assigning bin values to only N/4 bins. As an extreme example, a bin value may be assigned to only a single bin corresponding to the entire frequency range being compressed into a single bin.

As another example, an N-point FFT may be used to transform the received first signal into the frequency domain. A number of additional bins may be added to generate an increased number of bin values with each bin value being set to zero. For example, an extra N zero value bins may be added resulting in a frequency spectrum of 2N bins. A 2N inverse FFT may be performed in these 2N bins resulting in a frequency compression by a factor of two (a sampling frequency multiplication by a factor of two will also result and accordingly a time domain decimation may be performed on the resulting signal).

In some embodiments, the proportion of frequency bins that are assigned values from the bin values resulting from the FFT of the input signal is adjusted in response to the sound level indication. For example, for an increasing sound level the proportion of non-zero bins is reduced thereby resulting in an increased frequency compression to an increasingly narrow frequency band around the resonance frequency.

FIG. 4 illustrates a specific example of a frequency compressor 401.

In the example, the frequency compressor 401 comprises an amplitude detector 403 which is fed the first signal and which generates an amplitude signal reflecting the amplitude of the low frequency signal.

The amplitude detector 403 may for example consist in a single low pass filter. As another example, the amplitude detector 403 may comprise a peak detector or envelope detector with a suitable time constant. The time constant of the amplitude detector 403 is shorter than that of the amplitude averager 205. Thus, whereas the amplitude averager 205 generates an averaged amplitude estimate, the amplitude estimate of the amplitude detector 403 generates an amplitude estimate of the current amplitude of the low frequency signal. Typically, the time constant of the amplitude detector 403 is at least 2, 5 or 10 times lower than that of the amplitude averager 205.

The frequency compressor 401 furthermore comprises a frequency generator 405 which generates a carrier signal having a frequency falling in the second frequency interval. In the specific example, the carrier frequency is a fixed frequency that is set to be identical or very close to the resonance frequency of the sound transducer 109.

The frequency compressor 401 furthermore comprises a modulator 407 which is coupled to the amplitude detector 403 and the frequency generator 405 and which is operable to modulate the amplitude signal from the amplitude detector 403 onto the carrier from the frequency generator 403. The modulator 407 may specifically be implemented as a multiplier.

Thus, the output of the modulator 407 is a modulated tone signal having an amplitude corresponding to the amplitude of the low frequency signal. Thus, the energy of the low frequency signal in the first frequency interval is compressed into a narrow frequency range around the carrier frequency. Specifically, the frequency bandwidth of the resulting signal is equivalent to the frequency bandwidth of the amplitude signal generated by the amplitude detector 403.

In the example, the expander 105 thus performs the dynamic range expansion on the frequency compressed low frequency signal and thus the frequency compression is performed prior to the dynamic range expansion. Furthermore, in the example the averaged amplitude level indication is based on the low frequency signal before the frequency compression. This may in many scenarios provide particularly advantageous performance and/or facilitated implementation. However, it will be appreciated that in other embodiments other implementations may be used.

For example, in some embodiments, the dynamic range expansion may be performed prior to the frequency compression. Thus, in some embodiments, the frequency compressor 401 may be inserted between the expander 105 and the combiner 107 of FIG. 3 rather than between the band pass filter 203 and the expander 105 as illustrated in FIG. 4.

In the example of FIG. 4, the frequency compression and dynamic range expansion is closely integrated. For example, the threshold for determining whether to apply dynamic range expansion is determined on the basis of the low frequency signal prior to frequency compression and this threshold is compared to the amplitude signal generated by the amplitude detector 403. Thus, the determination of whether to apply dynamic range extension is based on a comparison of the current amplitude of the frequency compressed signal and the averaged amplitude estimate of the low frequency signal before frequency compression.

In the example, the attenuation is furthermore performed by applying the attenuation to the frequency compressed signal, i.e. to the amplitude modulated carrier. However, in other embodiments, the attenuation may be performed by directly attenuating the amplitude signal from the amplitude detector 403 before this is multiplied with the carrier signal from the signal generator 405.

The approach of using frequency compression to drive a transducer around a resonance frequency has been found to provide a particularly advantageous approach. In particular, the audio quality perception resulting from the frequency compression distortion has been found to be small. In particular for low frequencies it has been found that the psychoacoustic impact of concentrating signal energy in a narrow frequency band around a resonance frequency is very low.

Furthermore, the combination of the frequency compression and the dynamic range expansion provides a particularly advantageous effect where some of the perceived artifacts of the frequency compression are eliminated or mitigated by the dynamic range expansion. In particular, the driving of the sound transducer at the resonance frequency may in some scenarios result in a perception of increased boomyness or ringing of the bass sound and this is effectively reduced by the application of the dynamic range expansion. Furthermore, a particular efficient implementation can be achieved where e.g. a number of components and functions are useful for both the dynamic range expansion and the frequency compression.

Thus, the described dynamic range expansion approach may in particular counteract some of the effects introduced by the described frequency compression and resonance driving approach. In particular, the generated low frequency audio may be made punchier as the attack parts of the low frequency signal are accentuated by lowering the amplitude of the decaying parts.

Figure 5:
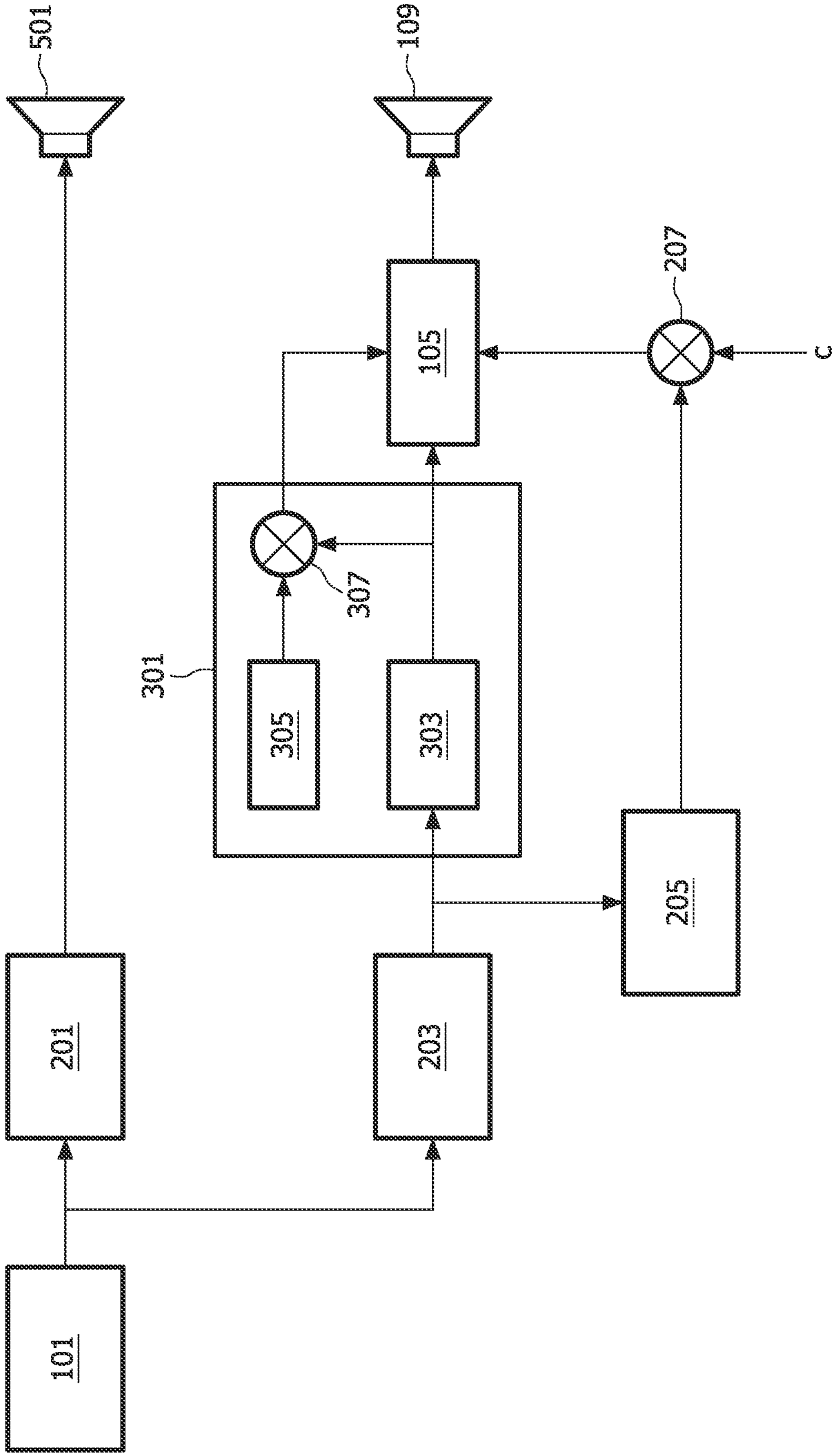
FIG. 5 is an illustration of an example of a sound system in accordance with some embodiments of the invention.

It will be appreciated that although FIG. 4 illustrates an example where the frequency compressed signal is combined with the high frequency signal to generate a drive signal fed to a single sound transducer, other approaches may be used in other embodiments. In particular, as illustrated in FIG. 5, the high frequency signal may be fed directly to a mid/high range sound transducer 501 whereas the frequency compressed (and dynamic range expanded) signal is fed directly to the high Q low frequency sound transducer 109 (e.g. a woofer) independently of the high pass signal.

Figure 6:
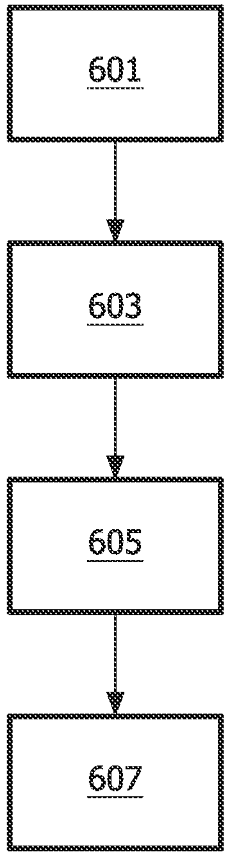
FIG. 6 is an illustration of an example of a method of generating a drive signal for a sound transducer in accordance with some embodiments of the invention.

FIG. 6 illustrates a method of generating a drive signal for a sound transducer.

The method initiates in step 601 wherein an input audio signal is provided.

Step 601 is followed by step 603 wherein the input audio signal is divided into at least a low frequency signal and a high frequency signal.

Step 603 is followed by step 605 wherein an expanded signal is generated by applying a dynamic range expansion to the low frequency signal.

Step 605 is followed by step 607 wherein the drive signal is generated by combining the expanded signal and the higher frequency signal.

It will be appreciated that the above description for clarity has described embodiments of the invention with reference to different functional units and processors. However, it will be apparent that any suitable distribution of functionality between different functional units or processors may be used without detracting from the invention. For example, functionality illustrated to be performed by separate processors or controllers may be performed by the same processor or controllers. Hence, references to specific functional units are only to be seen as references to suitable means for providing the described functionality rather than indicative of a strict logical or physical structure or organization.

The invention can be implemented in any suitable form including hardware, software, firmware or any combination of these. The invention may optionally be implemented at least partly as computer software running on one or more data processors and/or digital signal processors. The elements and components of an embodiment of the invention may be physically, functionally and logically implemented in any suitable way. Indeed the functionality may be implemented in a single unit, in a plurality of units or as part of other functional units. As such, the invention may be implemented in a single unit or may be physically and functionally distributed between different units and processors.

Although the present invention has been described in connection with some embodiments, it is not intended to be limited to the specific form set forth herein. Rather, the scope of the present invention is limited only by the accompanying claims. Additionally, although a feature may appear to be described in connection with particular embodiments, one skilled in the art would recognize that various features of the described embodiments may be combined in accordance with the invention. In the claims, the term comprising does not exclude the presence of other elements or steps.

Furthermore, although individually listed, a plurality of means, elements or method steps may be implemented by e.g. a single unit or processor. Additionally, although individual features may be included in different claims, these may possibly be advantageously combined, and the inclusion in different claims does not imply that a combination of features is not feasible and/or advantageous. Also the inclusion of a feature in one category of claims does not imply a limitation to this category but rather indicates that the feature is equally applicable to other claim categories as appropriate. Furthermore, the order of features in the claims do not imply any specific order in which the features must be worked and in particular the order of individual steps in a method claim does not imply that the steps must be performed in this order. Rather, the steps may be performed in any suitable order. In addition, singular references do not exclude a plurality. Thus references to “a”, “an”, “first”, “second” etc do not preclude a plurality. Reference signs in the claims are provided merely as a clarifying example shall not be construed as limiting the scope of the claims in any way.

The invention claimed is:

1. An apparatus for generating a drive signal for a sound transducer, the apparatus comprising:

a source for providing an input audio signal;

a divider for dividing the input audio signal into at least a low frequency signal and a high frequency signal;

an expander for generating an expanded signal by applying a dynamic range expansion to the low frequency signal, the expander further for adapting an application of the dynamic range expansion to the low frequency signal in response to a dynamically varied threshold determined as a function of at least an averaged amplitude level indication for the low frequency signal; and a combiner for generating the drive signal by combining the expanded signal and the higher frequency signal.

2. The apparatus of claim 1 wherein the expander is arranged to attenuate the low frequency signal if the input audio signal meets a first criterion.

3. The apparatus of claim 2 wherein the first criterion comprises a requirement that an amplitude level of the low frequency signal is below a threshold.

4. The apparatus of claim 2 wherein the expander is arranged to delay an application of a full attenuation of the low frequency signal following the detection of the first criterion being met.

5. The apparatus of claim 2 wherein the expander is arranged to terminate applying attenuation to the low frequency signal in response to a detection that the input audio signal meets a second criterion; and to delay the termination of applying attenuation to the low frequency signal following the detection of the second criterion being met.

6. The apparatus of claim 1 further comprising:

an amplitude averager for determining the averaged amplitude level indication for the low frequency signal; and a multiplier for setting a characteristic of the dynamic range expansion in response to the averaged amplitude level indication.

7. The apparatus of claim 6 wherein the characteristic is a criterion for applying an attenuation to the low frequency signal.

8. The apparatus of claim 7 wherein the criterion comprises a requirement that a current amplitude is below an amplitude threshold, and the multiplier is arranged to determine the amplitude threshold in response to the averaged amplitude level indication.

9. The apparatus of claim 8 wherein the multiplier is arranged to determine the amplitude threshold substantially as:

$$T=c\cdot A_A$$

where T is the amplitude threshold, c is a constant and $A_A$ is an averaged amplitude level of the low frequency signal indicated by the averaged amplitude level indication.

10. The apparatus of claim 6 wherein a time constant for determining the averaged amplitude level indication is between 75 and 200 msec.

11. An apparatus for generating a drive signal for a sound transducer, the apparatus comprising:

a source for providing an input audio signal;

a divider for dividing the input audio signal into at least a low frequency signal and a high frequency signal;

an expander for generating an expanded signal by applying a dynamic range expansion to the low frequency signal;

a combiner for generating the drive signal by combining the expanded signal and the higher frequency signal; and frequency compressor arranged to perform a frequency compression of at least one of the expanded signal and the low frequency signal from a first frequency interval to a smaller second frequency interval corresponding to a resonance frequency of the sound transducer.

12. The apparatus of claim 11 wherein the frequency compressor is arranged to perform the frequency compression of the low frequency signal prior to the dynamic range expansion, the apparatus further comprising:

an amplitude average for determining an averaged amplitude level indication for the low frequency signal component prior to the frequency compression; and a multiplier for setting a characteristic of the dynamic range expansion in response to the averaged amplitude level indication.

13. The apparatus of claim 11 wherein the frequency compressor comprises:

an amplitude detector for generating an amplitude signal for the at least one of the low frequency signal and the expanded signal;

a frequency generator for generating a carrier signal in the second frequency interval; and a modulator for generating a frequency compressed version of the at least one of the low frequency signal and the expanded signal by modulating the carrier signal by the amplitude signal.

14. The apparatus of claim 13 wherein the expander is further arranged to determine whether to apply the dynamic range expansion in response to the amplitude signal.

15. A method of generating a drive signal for a sound transducer, the method comprising:

providing an input audio signal;

dividing the input audio signal into at least a low frequency signal and a high frequency signal;

generating an expanded signal by applying a dynamic range expansion to the low frequency signal and adapting an application of the dynamic range expansion to the low frequency signal in response to a dynamically varied threshold determined as a function of at least an averaged amplitude level indication for the low frequency signal; and generating the drive signal by combining the expanded signal and the higher frequency signal.

* * * * *